US007265968B2

(12) United States Patent  (10) Patent No.: US 7,265,968 B2
Champion et al.  (45) Date of Patent:  *Sep. 4, 2007

(54) APPARATUS, SYSTEM, AND METHOD FOR TOOLLESS INSTALLATION AND REMOVAL OF AN EXPANSION CARD

(75) Inventors: David Frederick Champion, Durham, NC (US); Brian Michael Kerrigan, Cary, NC (US); Michael Sven Miller, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 272 days.

This patent is subject to a terminal disclaimer.

(21) Appl. No.: 10/970,148

(22) Filed: Oct. 21, 2004

(65) Prior Publication Data

US 2006/0087801 A1  Apr. 27, 2006

(51) Int. Cl.
*H05K 5/00* (2006.01)
(52) U.S. Cl. ..................................................... 361/679
(58) Field of Classification Search ................ 361/679
See application file for complete search history.

(56) References Cited

U.S. PATENT DOCUMENTS 5,058,045 A * 10/1991 Ma ............................ 361/683
5,868,585 A    2/1999  Barthel et al. ............... 439/377
6,056,579 A    5/2000  Richards, III et al. ....... 439/258
6,062,894 A    5/2000  Barringer .................... 439/377
6,288,911 B1   9/2001  Aoki et al. .................. 361/801
6,411,517 B1   6/2002  Rabin ......................... 361/759
6,496,385 B1  12/2002  Smithson et al. ........... 361/801
6,982,867 B2 * 1/2006  Carr et al. .................. 361/679
2002/0081890 A1 6/2002 Obermaier ................... 439/377

OTHER PUBLICATIONS

IBM Disclosure, "Circuit Card Insertion/Extraction/Retention System", vol. 35 No. 3 Aug. 1992, p. 41-42.
Dennis Barringer, et al. "Cassette housing for printed circuit cards".

* cited by examiner

*Primary Examiner*—Yean-Hsi Chang
(74) *Attorney, Agent, or Firm*—Kunzler & McKenzie

(57) ABSTRACT

A cassette for toolless installation and removal of an expansion card is disclosed. The cassette is provided with a detachable front plate, back plate, and side plate for substantially enclosing an expansion card. The front plate and back plate is pivotally coupled. The back plate includes horizontal and vertical zip slides, allowing the cassette to adjust to expansion cards of various sizes. A chassis is prepared for insertion of the cassette by opening a chassis top plate. The cassette is then be inserted into the chassis from a substantially horizontal approach and secured therein by a cassette coupler. A user then pivots the cassette downward, such that the conductive pins of the expansion card sequentially engage the expansion connector. The chassis top plate is then closed, securing the conductive pins of the expansion card in the expansion connector.

21 Claims, 10 Drawing Sheets

APPARATUS, SYSTEM, AND METHOD FOR TOOLLESS INSTALLATION AND REMOVAL OF AN EXPANSION CARD

BACKGROUND OF THE INVENTION

1. Field of the Invention

The invention relates generally to expansion card devices, methods, and systems. Specifically, the invention relates to devices for installing and removing expansion cards.

2. Description of the Related Art

A computer typically comprises a variety of intricate components including expansion cards, such as PCI cards. In some instances, expansion cards are a costly component of such architectures. Some expansion cards may be installed or removed from the system while the system is still running. Such an installation or removal (known as "hot swapping" or "blind swapping") is properly performed without violation of the grounding, safety, or operation of the system.

Cassettes are often used to facilitate the safe and efficient installation and removal of expansion cards. Using a cassette to install an expansion card often involves attaching the expansion card to a cassette, sliding the cassette into a chassis, and inserting the conductive pins of the expansion card into the motherboard docket. Removal of the expansion card involves reversal of the installation steps.

Unfortunately, current cassettes include significant disadvantages. For instance some cassettes do not sufficiently protect the expansion card because they provide a mere frame or single plate. An expansion card is often installed and removed from an expansion connector repeatedly. Each installation or removal can require thirty (30) to thirty-five (35) pounds of pressure. Further, an expansion connector is often difficult to access because of the intricate structure of a motherboard. The repeated installation pressure exerted on the intricate structure of a motherboard and the delicate circuits, pins, and connection fingers of an expansion card create a dangerous environment for the expansion card.

Many cassettes known in the art provide a mere frame or a single plate to protect the delicate components of the expansion card. Such structures leave substantial, yet sensitive, portions of the card exposed. Consequently, these structurally inadequate cassettes unnecessarily increase the probability that the installation procedure will result in a cracked expansion card, severed circuit, or broken conductive pin. What is needed is a cassette that is configured to completely shield the expansion card from the stresses of installation and removal.

Some cassettes are so complex they require the costly aid of a professional technician. Consumers, such as businesses and other organizations often invest in computer technology to increase productivity and decrease costs. However, at times, the technology is so complex as to require the consumer to employ a professional technician to operate or otherwise maintain the computer system. The more a computer system requires the attention of a professional technician, the less effective the system is at increasing productivity and decreasing costs.

Some cassettes provide complex structures including levers, pins, brackets, and screws that require tools to secure an expansion card to a cassette. Such cassettes may require the attention of a professional technician, thereby decreasing productivity and increasing costs. What is needed is a cassette that does not require tools or professional technicians to operate or install an expansion card.

Additionally, currently available cassettes can greatly increase the costs of maintaining computer systems because they cannot adjust to the size of various expansion cards. Over time, a computer system can require expansion cards of various sizes. Even when two cards are similar in function and innovation, they may be substantially different in size due to of the circuitry layout and plastic backing of the card. Because cassettes are unable to adjust to expansion cards of various sizes, they must be replaced as well. Having to replace the cassette along with the expansion card greatly increases the costs of maintaining a computer system. What is needed is a cassette that is adjustable to expansion cards of various sizes.

SUMMARY OF THE INVENTION

The present invention has been developed in response to the present state of the art, and in particular, in response to the problems and needs in the art that have not yet been fully solved by currently available expansion card mounting systems. Accordingly, the present invention has been developed to provide an apparatus, system, and method for mounting an expansion card that overcome many or all of the above-discussed shortcomings in the art.

The apparatus, in one embodiment, is configured to provide a means for blind swapping of expansion cards. An expansion card may be substantially enclosed within an adjustable cassette. The cassette may then be inserted into a chassis in a substantially horizontal approach and pivoted downward to engage the expansion card with an expansion connector.

In one embodiment, a cassette includes a front plate, back plate, and side plate, defining an interior for the expansion card. The tail stock of the expansion card is secured to the side plate by a card coupler such as a hook and a latch. The base of the tail stock in one embodiment is inserted into the hook, and the tail stock is rotated upwardly such that the top of the tail stock engages, and is secured by, the latch.

The expansion card is then secured to the back plate by a card fastener, such as one or more zip slides. The zip slides in certain embodiments comprise an adjustable stop slidably secured to a channel. The expansion card is secured to the back plate by adjusting the stop along the channel to engage the edges of the expansion card. In this manner, the cassette is capable of accommodating cards of varying sizes. A card guide connected to the back plate aligns the expansion card during adjustment. The card guide may comprise a horizontal tab for securing the base of the expansion and may be located along the same edge as the conductive pins of the expansion card.

The front plate may then be secured by a tab receiver of the side plate. The tab receiver of the side plate receives the tab of the front plate to secure the front plate to the side plate and to restrict the pivot motion of the cassette such that the pivot motion does not disfigure the cassette.

The front plate and back plate may be pivotally coupled by a pivot stud connected to the back plate. A pivot stud lock on the front plate may prevent removal of the front plate from the pivot stud. In one embodiment, the pivot stud is inserted into an aperture on the front plate, and the pivot stud lock is slid into place, pinching the pivot stud between the front plate and the lock. Once secured, the back plate may pivot with respect to the front plate.

The apparatus is further configured, in one embodiment, to provide a handle for inserting the cassette into a chassis. In certain embodiments, the handle is attached to the side plate. Once in the chassis, the cassette is registered with a cassette coupler serving to stabilize the cassette within the chassis. In select embodiments, the cassette coupler engages the pivot stud and secures the cassette, such that the back plate may be pivoted downward, engaging the expansion card connection fingers with the expansion connector in a phased manner.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

Figure 1:
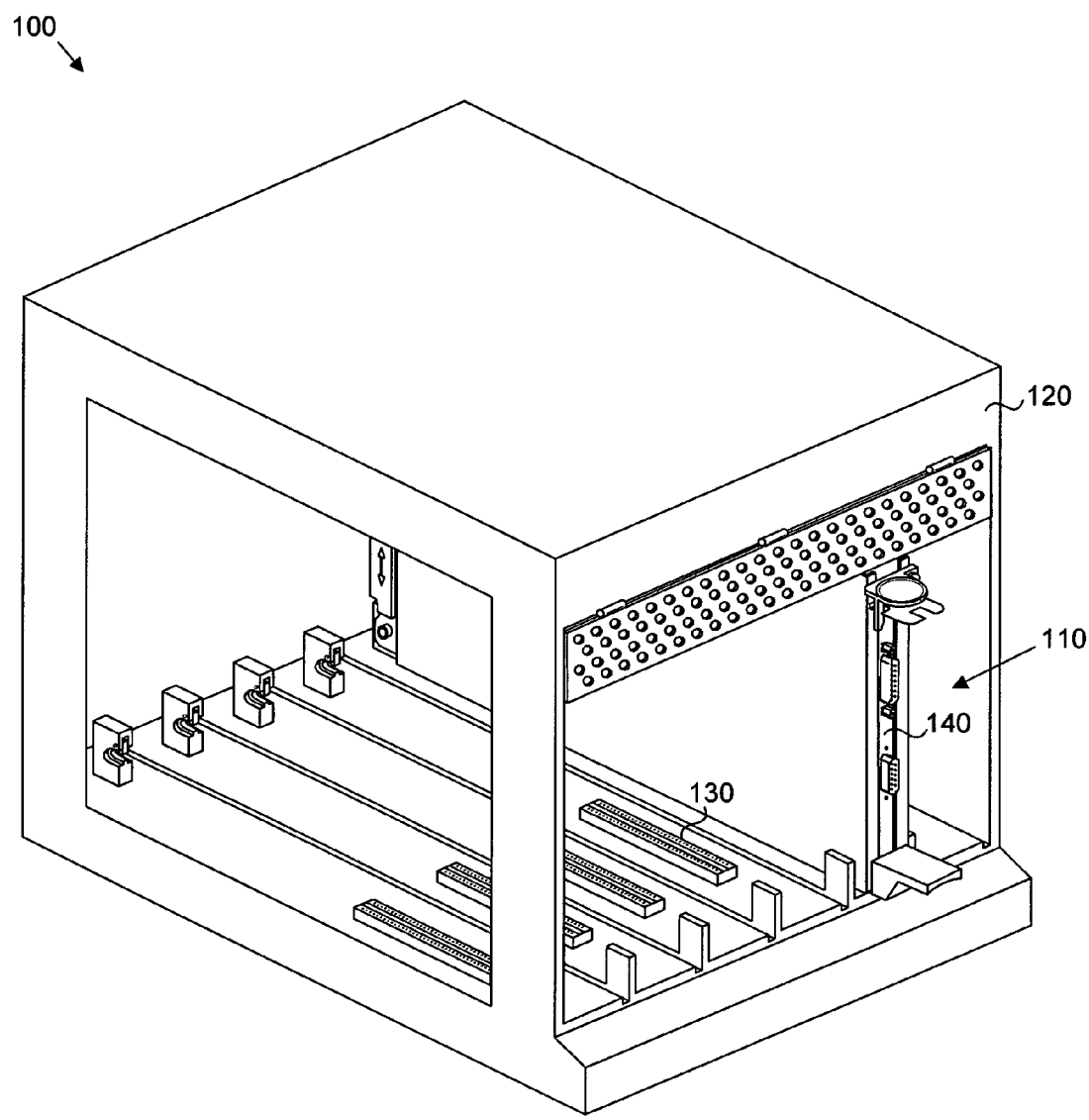
FIG. 1 is a perspective view of one embodiment of a cassette housed within a chassis in accordance with the current invention.

FIG. 1 illustrates one embodiment of a system 100 for toolless installation and removal of an expansion card 140. The depicted system 100 includes a cassette 110, a chassis 120, and one or more expansion connectors 130 and an expansion card 140. The chassis 120 and expansion connector 130 are configured to be mounted on a motherboard or to be part of a rack-mounted server. In the illustrated embodiment, the expansion card 140 is secured within a cassette 110, which serves to protect the expansion card and provides a standard interface with the chassis 120. In one embodiment of the system 100, the cassette 110 is inserted into a chassis 120, and then pivoted downward to engage a portion of the expansion card 140 with the expansion connector 130.

Figure 2:
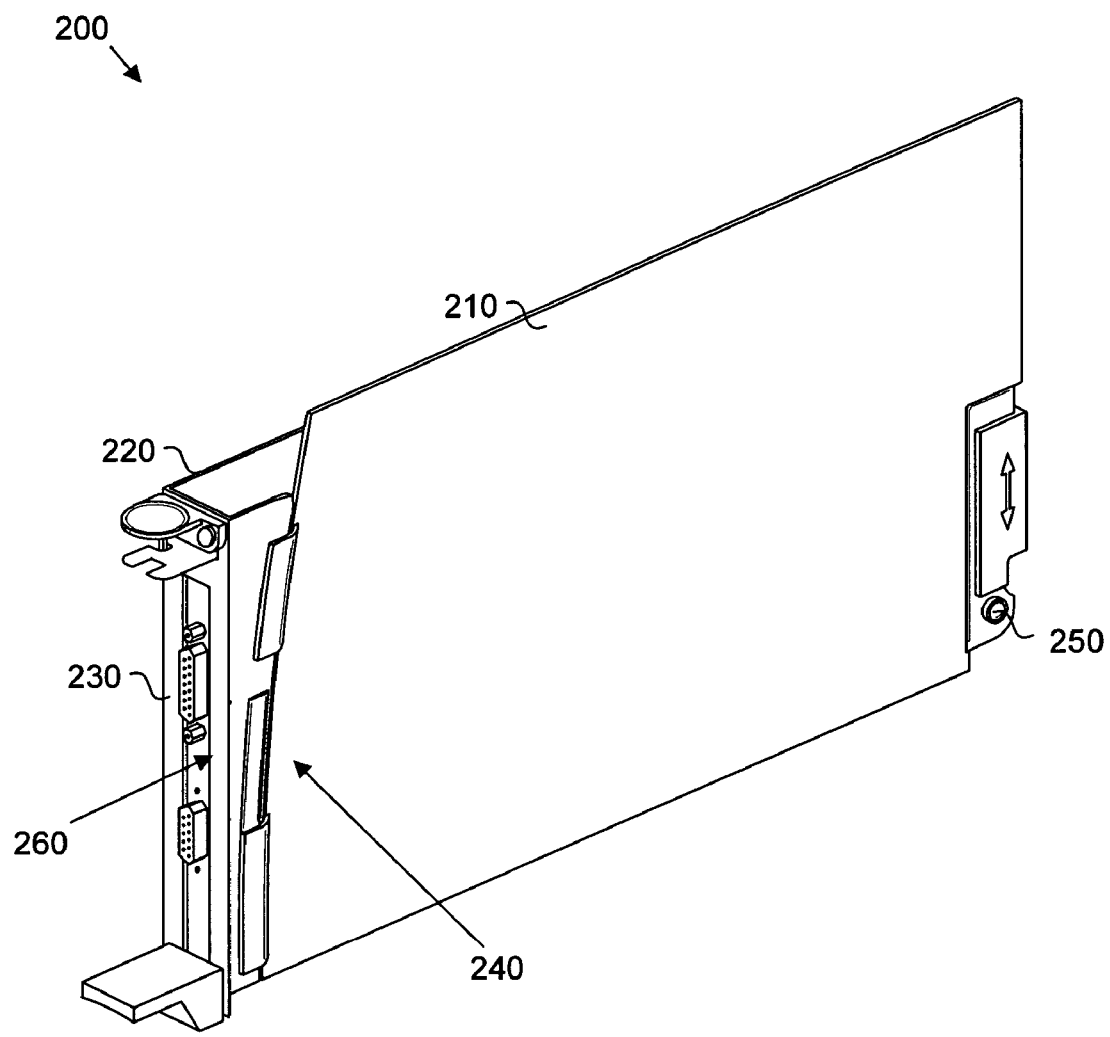
FIG. 2 is a perspective view of one embodiment of a cassette in accordance with the current invention.

FIG. 2 illustrates one embodiment of a cassette 200. The cassette 200 is one example of the cassette 110 illustrated in FIG. 1 and includes a side plate 230, a back plate 220, and a front plate 210, collectively defining an interior for substantially enclosing an expansion card 140 (FIG. 1). The side plate 230 and back plate 220 may be monolithic, while the front plate 210 may be coupled with the back plate 220 by a plate coupler 250 and to the side plate 230 by a tab 240 and tab receiver 260, as will be described later in further detail. Each plate 230, 220, and 210 may be formed by a durable, heat resistant material such as metal to protect the expansion card from the heat, stresses, and pressures involved with installing, operating, and removing an expansion card. Also, the plates 230, 220, and 210 may be formed from sheets of metal for fast and cost efficient production. In one embodiment, the front plate 210, along with the card coupler 250, secures the cassette 110 in the chassis 120 and the back plate 220 pivots to enable pivotal mating of the expansion card 140 with the expansion connector 130 of the chassis 120 (See FIG. 1).

Figure 3:
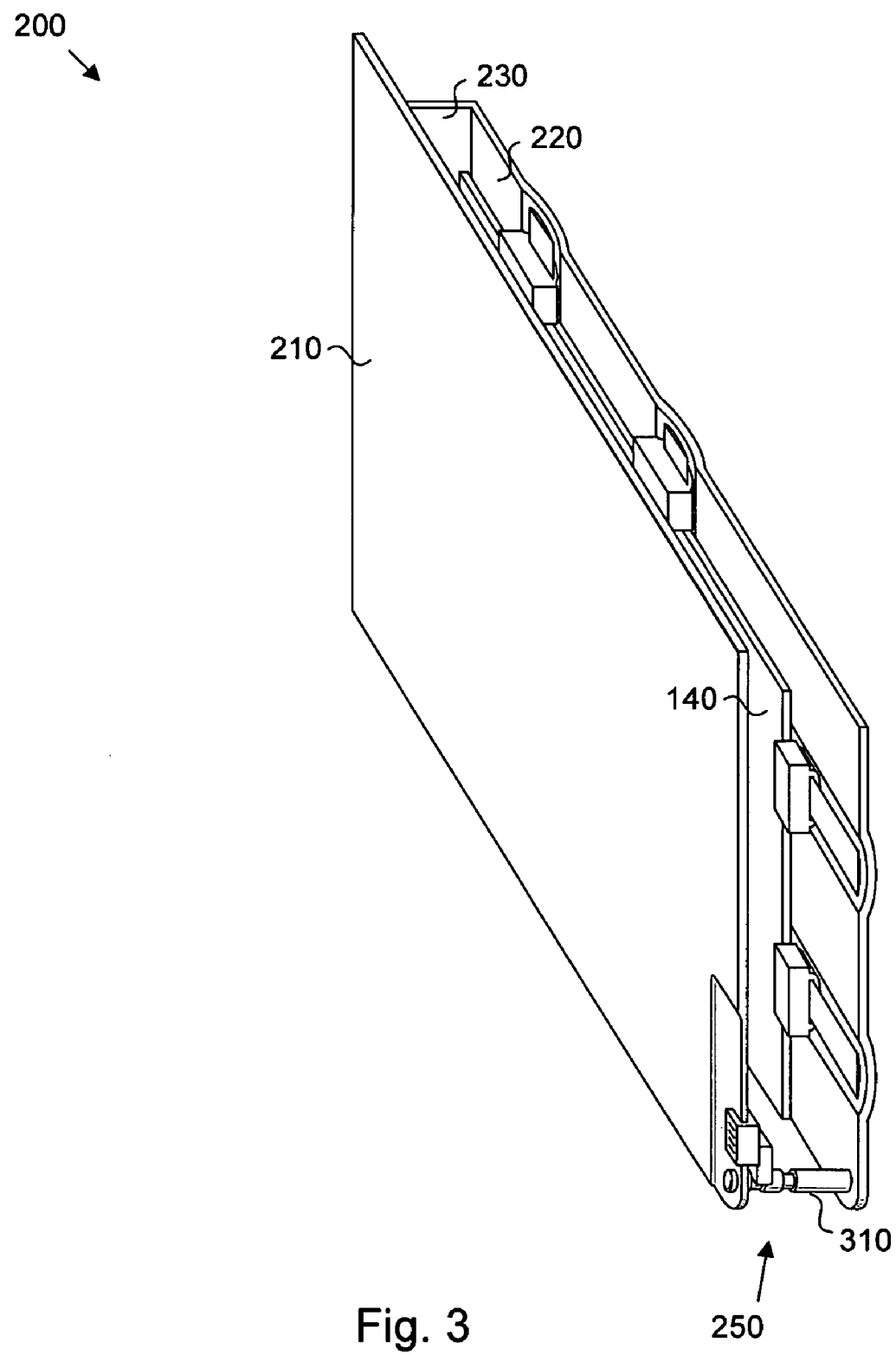
FIG. 3 is a rear perspective view of one embodiment of a cassette in accordance with the current invention.

FIG. 3 illustrates a rear view of the cassette 200 described in relation to FIG. 2. In the illustrated embodiment, the front plate 210 and back plate 220 are pivotally coupled by a pivot stud 310, allowing the back plate 220 to pivot with respect to the front plate 210. As will be described later in more detail, an expansion card 140 attached to the back plate 220, to be pivotally mated with an expansion connector 130 (See FIG. 1). A portion of the pivot stud 310 may be exposed to facilitate coupling the cassette 200 with a chassis 120 (See FIG. 1). The pivoting motion and the exposed pivot stud 310 enable a user to couple the cassette 200 with a chassis 120 and pivot the expansion card 140 into the expansion connector 130 without the use of tools. In certain embodiments, separate structures may perform these separate functions. For example, a separate stud or hook may secure to the front plate 210 to provide a point of securement to a chassis 120.

Figure 4:
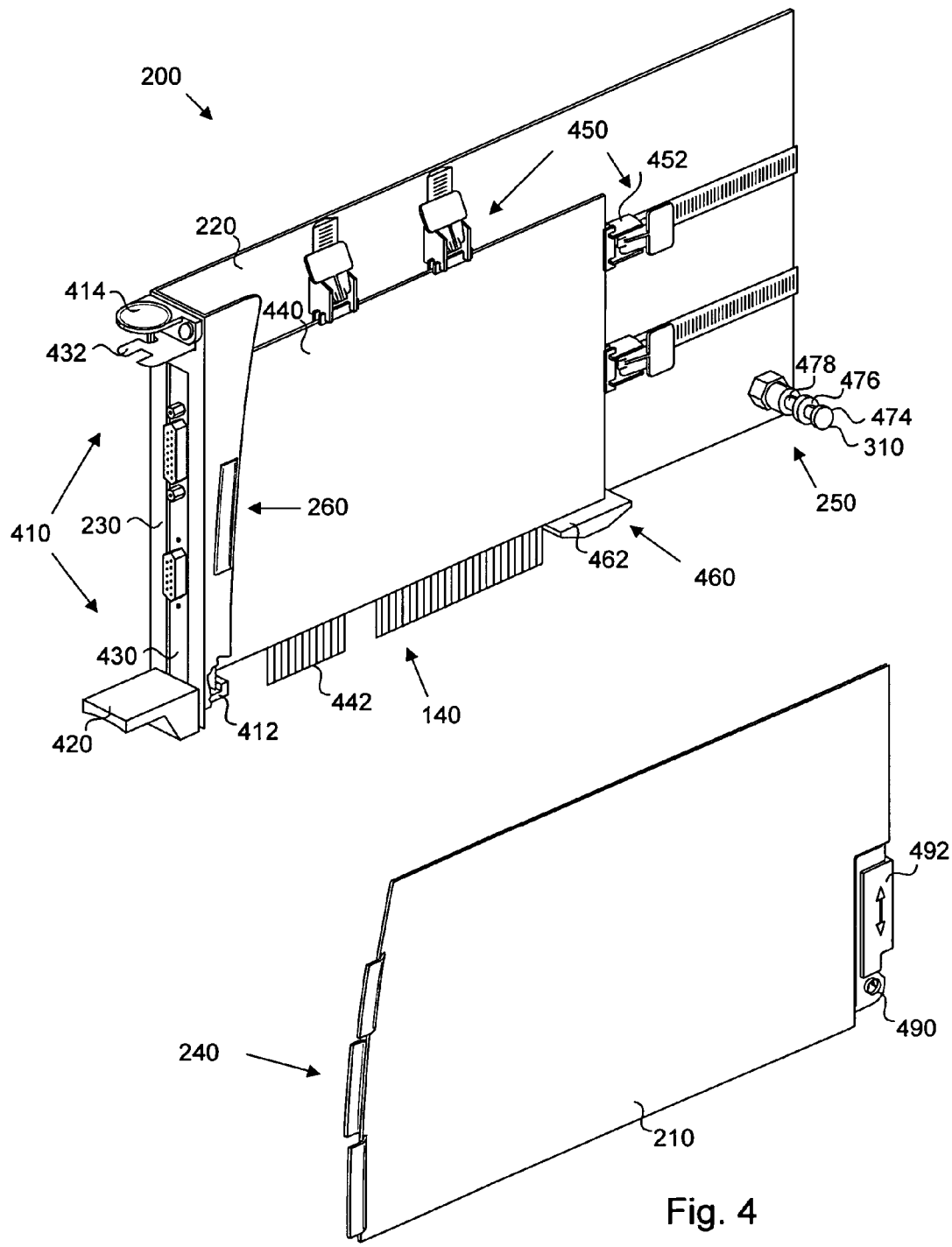
FIG. 4 is a perspective view of one embodiment of a disassembled cassette in accordance with the current invention.

FIG. 4 illustrates one embodiment of a disassembled cassette 200 with an expansion card 140. The expansion card 140 includes a tail stock 430, circuit board 440, and connection fingers 442. The tail stock 430 may be positioned substantially perpendicular to the circuit board 440 and may extend beyond the top and bottom of the circuit board 440. The top of the tail stock 430 may include a tail stock lip 432 extending substantially perpendicular to the tail stock 430. The connection fingers 442 may be positioned at the bottom of the circuit board 440 and may serve to electrically connect the circuit board 440 to an expansion connector 130 (See FIG. 1). As will be explained later in further detail, the expansion card 140 may be inserted into the cassette 200 by coupling the tail stock 430 to the side plate 230 and by coupling the circuit board 440 to the back plate 220. In this configuration, the cassette 200 protects the expansion card 140 during installation, operation, and removal.

The disassembled cassette 200 includes a side plate 230 having a card coupler 410, a handle 420, and a tab receiver 260; a back plate 220 having a card fastener 450 and plate coupler 250; and a front plate 210 having a tab 240, aperture 490, and plate lock 492. The several features of the cassette 200 function harmoniously to secure the expansion card 140 within the cassette 200 and the cassette 200 within a chassis 120 (See FIG. 1).

The side plate 230 comprises a card coupler 410, such as a hook 412 and latch 414 for securing the tail stock 430 of the expansion card 140. The hook 412, in one embodiment, may be positioned at the bottom of the side plate 230 and is configured to engage the bottom of the tail stock 430. Because the bottom of the tail stock 430 extends beyond the bottom of the circuit board 440, the tail stock 430 may be inserted into the hook 412 without interference from the circuit board 440. As will be described later in further detail, in one embodiment, the latch 414 is positioned at the top of the side plate 230 and is configured to engage and secure the tail stock lip 432. Consequently, the tail stock 430 of the expansion card 140 may be firmly secured to the side plate 230 of the cassette 200 without the use of tools.

The side plate 220 may also include a tab receiver 260 for engaging the tab 240 of the front plate 210 and a handle 420 for facilitating insertion of the cassette 200 into the chassis 120. As will be described later in further detail, the tab receiver 260 limits the pivot range of the cassette 200, ensuring the overall integrity of the cassette 200. The handle 420 enables a user to guide and pivot the cassette into a chassis 120 and expansion connector 130.

The back plate 220 in one embodiment includes a card guide 460. The card guide 460 may comprise a longitudinally extending tab 462 for registering the bottom of the circuit board 440. The card guide 460 aids in coupling the expansion card 140 with the back plate 220. In an alternative embodiment, the card guide 460 may comprise a longitudinally extending tab 462 and a vertically extending face. In such an embodiment, a bottom edge of the expansion card 140 may be captured between the face of the card guide 460 and the back plate 220, securing the expansion card 140 to the back plate 220.

The back plate 220 in one embodiment also includes a card fastener 450 for securing the top and side of the circuit board 440 to the back plate 220. Additionally, the card fastener 450 ensures that the expansion card 140 is secured to the cassette 200. The card fastener 450 may also comprise a set of longitudinally and vertically adjustable zip slides 452. The adjustability of the zip slides 452 enables expansion cards 140 of various sizes to be secured to the cassette 200.

Furthermore, the back plate 220 may include a plate coupler 250, such as a pivot stud 310 positioned near the posterior of the back plate 220. The pivot stud 310 includes a plate insert 474 and a lock groove 476 for pivotally coupling the back plate 220 with the front plate 210, and a chassis groove 478 for subsequently coupling the cassette 200 with the chassis 120. Pivotally coupling the front plate 210 and back plate 220 allows the expansion card 140 to engage the expansion connector 130 (See FIG. 1) in a phased manner, greatly reducing the force needed to insert the expansion card 140. Also, by securing the back plate 220 to the front plate 210 and the cassette 200 to the chassis 120, the pivot stud 310, which performs both functions, reduces the total number of functional components of the cassette 200, thereby providing a simple and easy to use device.

Figure 5E:
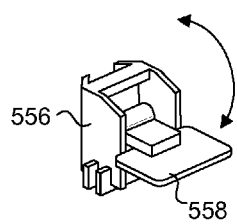
FIG. 5E is a perspective view of one embodiment of a movable stop, zip slide handle, and zip slide lock in a closed position in accordance with the current invention.
Figure 5D:
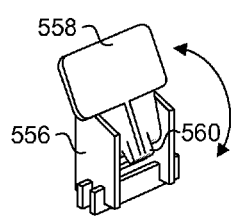
FIG. 5D is a perspective of one embodiment of a movable stop, zip slide handle, and zip slide lock in an open position in accordance with the current invention.
Figure 5A:
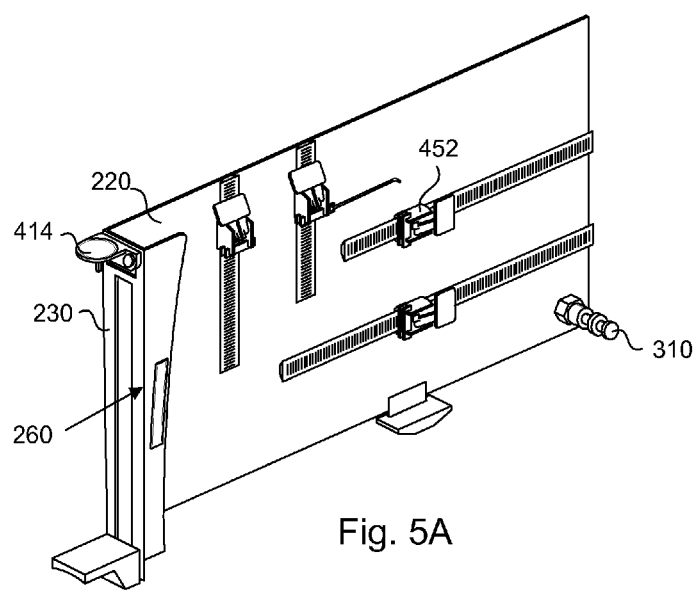
FIG. 5A is a perspective view of one embodiment of a back plate and side plate of a cassette in accordance with the current invention.

FIG. 5A illustrates one embodiment of a side plate 230 and a back plate 220 of a cassette 200. As discussed, the side plate 230 comprises a latch 414 and a tab receiver 260. The back plate 220 comprises longitudinal and vertical zip slides 452, and a pivot stud 310. FIG. 5A provides a reference for subsequent figures that demonstrate close-up views of the various features of the cassette 200.

Figure 5B:
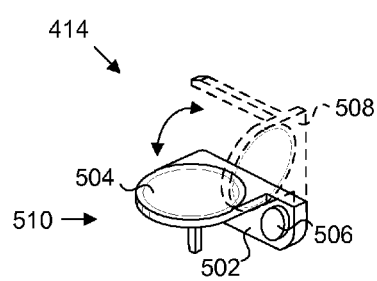
FIG. 5B is a perspective view of one embodiment of a latch in accordance with the current invention.

FIG. 5B illustrates one embodiment of a latch 414. The latch 414 is, in the depicted embodiment a vertical tab 502 and a latch handle 504 secured to the side plate 230 by a latch pivot 506. To receive the tail stock 430 of the expansion card 140 (See FIG. 4), the latch 414 must be in an open position 508. The latch 414 is opened by grasping the latch handle 504 and pivoting the latch 414 upward. Once open, the tail stock 430 is fitted to the side plate 230 (See FIG. 4). The latch 414 may be pivoted to a closed position 510 by grasping the latch handle 504 and pivoting the latch 414 downward until the vertical tab 502 engages the lip of the tail stock 432 (See FIG. 4). Rotating and securing the latch 414 in this manner enables the user to secure the tail stock 432 to the side plate 230 quickly and without the use of tools.

Figure 5C:
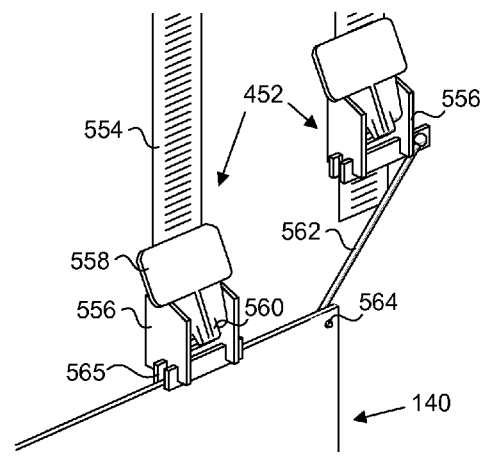
FIG. 5C is a perspective view of one embodiment of a zip slide and zip slide arm in accordance with the current invention.

FIG. 5C illustrates one embodiment of a zip slide 452 and zip slide arm 562. The zip slide 452 in the depicted embodiment includes a stop guide 554, a movable stop 556, a zip slide handle 558, and zip slide lock 560. In the illustrated embodiment, the movable stop 556 of the zip slide 452 mates with the expansion card's circuit board 440 and locks into place, thereby securing an expansion card 140 to the back plate 220 (See FIG. 4).

To adjust and lock the movable stop 556 along the stop guide 554, the zip slide handle 558 is rotated to an upward position (See FIG. 5D), disabling the zip slide lock 560 and allowing the movable stop 556 to slide along the stop guide 554. The moveable stop 556 may include a groove 565 to engage the edges of the circuit board 440. When the movable stop 556 mates with the edge of the circuit board 440, the handle 558 is rotated downward (See FIG. 5E) enabling the zip slide lock 560 to secure the movable stop 556 in place. Similar to the aforementioned latch 414, the zip slides 452 enable the user to secure the circuit board 440 to the back plate 220 in a quick and toolless manner. In certain embodiments, the stop guide 554 may have a grooved surface to enable the movable stop 556 to be readily set at a location along the stop guide 554 and secured into place by enabling the zip slide lock 560 (See FIG. 5A).

In the illustrated embodiment, a zip slide 452 includes an arm 562 pivotally attached to a movable stop 556 for securing smaller expansion cards 140 (See FIG. 5C). The arm 562 may comprise an insert 564 for engaging an aperture on an expansion card 140 that is too small to contact the moveable stop 556. At times, the moveable stop 556 cannot reach the circuit board 440 because the stop guide 554 upon which the moveable stop 556 adjusts is cut short by a perpendicular stop guide 554. In such circumstances, the arm 562 extends to engage the expansion card 140 when the moveable stop 556 cannot. Because the arm 562 is attached to a movable stop 556 of a zip slide 452, the arm 562 is able to secure expansion cards 140 of varying sizes by locking in various locations along the stop guide 554. Thus, the arm 562 enables the cassette 200 to adjust to very small expansion cards 140.

Figure 6A:
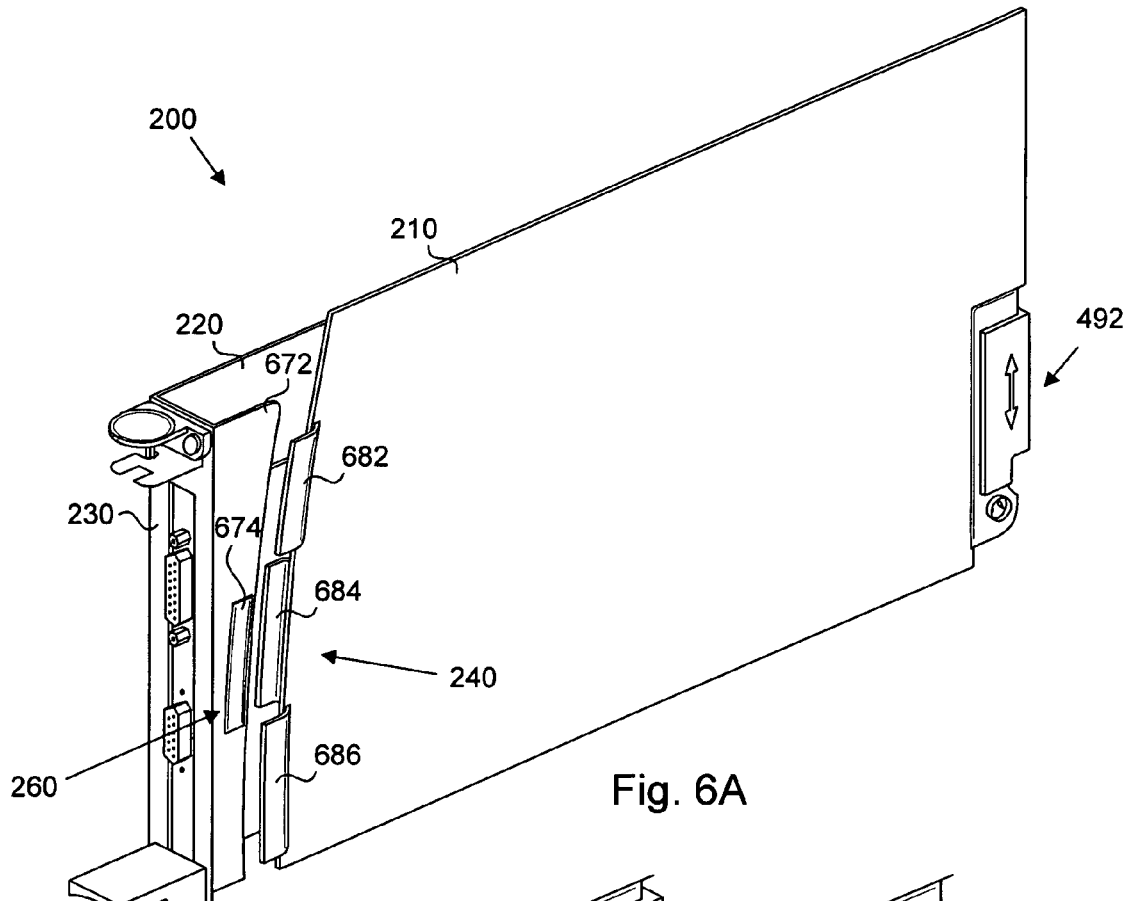
FIG. 6A is a perspective view of one embodiment of a cassette and a tab in accordance with the current invention.

FIG. 6A illustrates one embodiment of a cassette 200 with a tab 240 and a tab stop 670. The tab stop 670 of the side plate 230 comprises a flat base 672 with a restraining portion 674 for engaging the tab 240 of the front plate 210. The tab 240 comprises a first stop tab 682, a restraining tab 684, and a second stop tab 686. Thus, the restraining tab 684 is positioned below the surface of the front plate 210 and serves to capture the flat base 672 of the tab stop 670 between itself and the first and second stop tabs 682, 686. The first stop tab 682 and second stop tab 686 are positioned above the surface of the front plate 210. When engaged with the tab receiver 260 of the side plate 230, the first stop tab 682 and second stop tab 686 extend above the flat base 672 and are positioned on either side of the restraining portion 674. Once engaged, the restraining portion 674 restricts the pivot range of the back plate 220 inasmuch as the first stop tab 682 and second stop tab 686 cannot pass over the restraining portion 674 of the tab receiver 260. This manner of coupling the side plate 230 and the front plate 210 provides a toolless means for coupling the plates 230 and 210 and restricting the pivoting range of the cassette 200.

Figures 6B, 6C:
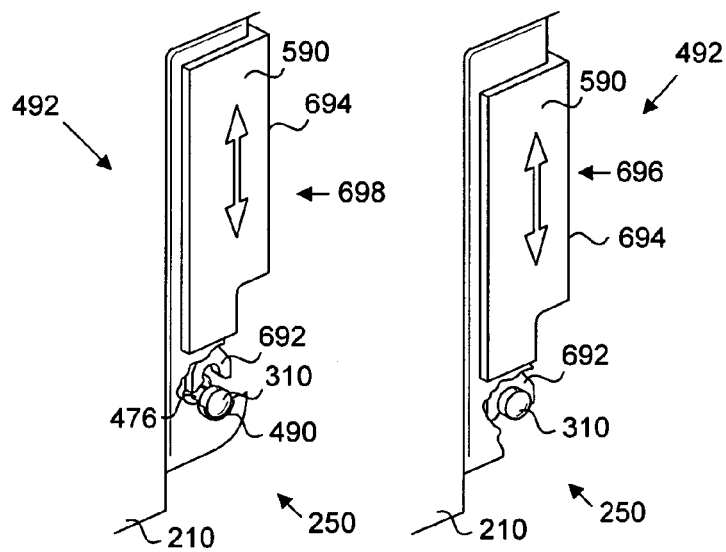
FIG. 6B is a perspective view of one embodiment of a plate lock in an open position in accordance with the current invention.
FIG. 6C is a perspective view of one embodiment of a plate lock in a closed position in accordance with the current invention.

FIGS. 6B and 6C illustrate one embodiment of a plate lock 492 in relation to FIG. 6A. The plate lock 492 may comprise a spring loaded slide 694 and a slot 692 configured to engage the lock groove 476 of the pivot stud 310. To engage the lock 492 with the pivot stud 310, a user slides the lock 492 to an open position 698 and registers the aperture 490 of the front plate 210 with the plate insert 474 (See FIG. 4) of the pivot stud 310. Then the user releases the spring loaded slide 694, allowing the slot 692 to register with the lock groove 476 of the pivot stud 310.

When engaged, the plate lock 492 secures the front plate 210 to the pivot stud 310 by preventing removal of the pivot stud 310 from the aperture 490. The lock 492 may be biased to urge the slot 692 over the lock groove 476 to prevent removal of the pivot stud 310. In order to remove the front plate 210 from the pivot stud 310, the spring loaded lock 694 may be slid away from the pivot stud 310 to disengage the slot 692 from the lock groove 476, permitting the pivot stud 310 to be removed from the aperture 490. Thus, the plate lock 492 allows a user to pivotally couple the front plate 210 and back plate 220 in a toolless manner.

Figure 7:
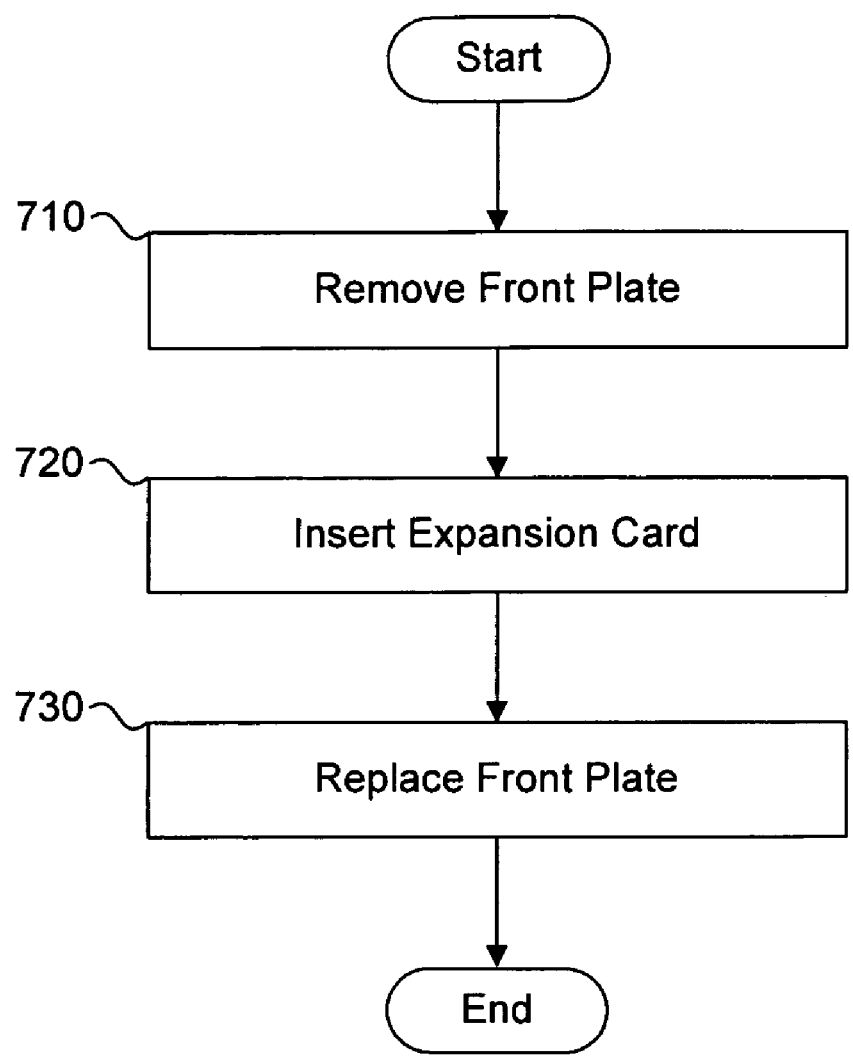
FIG. 7 is a process flow chart diagram of one embodiment of a method for inserting an expansion card into a cassette.

FIG. 7 is a process flow chart diagram illustrating a method 700 for inserting an expansion card 140 into a cassette 200. The method 700 in the depicted embodiment includes the steps of removing 710 the front plate 210 from the cassette 200, securing 720 the expansion card 140 to the cassette 200, and replacing 730 the front plate 210. Throughout the description of the method 700 there will be multiple references to FIGS. 2, 4, 5A, 5B, 5C, 5D, 5E, 6A, 6B, and 6C, in as much as the method 700 may involve considerable detail.

Removing 710 the front plate 210 from the cassette 200 preferably involves sliding the plate lock 492 away from the pivot stud 310 and removing the front plate 210 from the pivot stud 310. The front plate 210 may then be detached from the tab receiver 260 of the side plate 230 by disengaging the tab 240 from the tab receiver 260 (See FIG. 6A). Once completed, the front plate 210 is completely removed from the cassette 200, exposing the back plate 220 and side plate 230 (See FIG. 5A).

Securing 720 the expansion card 140 to the cassette 200 includes placing the bottom of the tail stock 430 in the hook 412 and pivoting the tail stock 430 upwardly until it is flush with the side plate 230 (See FIG. 4). At this point, the tail stock lip 432 registers with the latch 414 in the open position 508 (See FIG. 5B). The latch 414 is then pivoted downward, until the vertically tab 502 contacts the tail stock lip 432 (See FIG. 4). Once completed, the tail stock 430 is secured to the side plate 230.

The circuit board 440 of the expansion card 140 may then be secured to the back plate 220 by registering the base of the circuit board 440 with the card guide 460 (See FIG. 4). Then, the zip slide handle 558 is rotated into an open position (See FIG. 5D), disengaging the zip slide lock 560, such that the movable stop 556 may then slide along the stop guide 554 (See FIG. 5C). The movable stop 556 is then adjusted along the stop guide 554 to register with the edge of the circuit board 440, and the zip slide handle 558 is rotated to a closed position (See FIG. 5E), engaging the zip slide lock 560 and securing the moveable stop 556 in place (See FIG. 4). Once completed, the circuit board 440 is secured to the back plate 220.

Replacing 730 the front plate 210 includes registering the tab 240 of the front plate 210 with the tab receiver 260 of the side plate 230 (See FIG. 6A). The tab 240 engages the tab stop 670 by positioning the restraining tab 684 below the flat base 672 of the tab receiver 260. The first stop tab 682 and second stop tab 686 are positioned above the flat base 672, such that the first stop tab 682 and the second stop tab 686 are on either side of the restraining portion 674. Securing the front plate 210 to the side plate 230 in this manner restricts the pivoting range of the back plate 220 as the first stop tab 682 and the second stop tab 686 come into contact with the restraining portion 674.

The front plate 210 is then secured to the pivot stud 310 of the back plate 220 by sliding the plate lock 492 into an open position 698 and registering the pivot insert 474 with the aperture 490 of the front plate 210 (See FIGS. 6B and 6C). The plate lock 492 may then engage the lock groove 476 of the pivot stud 310, pinching the pivot stud 310 between the aperture 490 and the plate lock 492 of the front plate 210. When completed, the front plate 210 is secured to the back plate 220, and the expansion card 140 is substantially enclosed within an interior (See FIG. 2).

Figure 8:
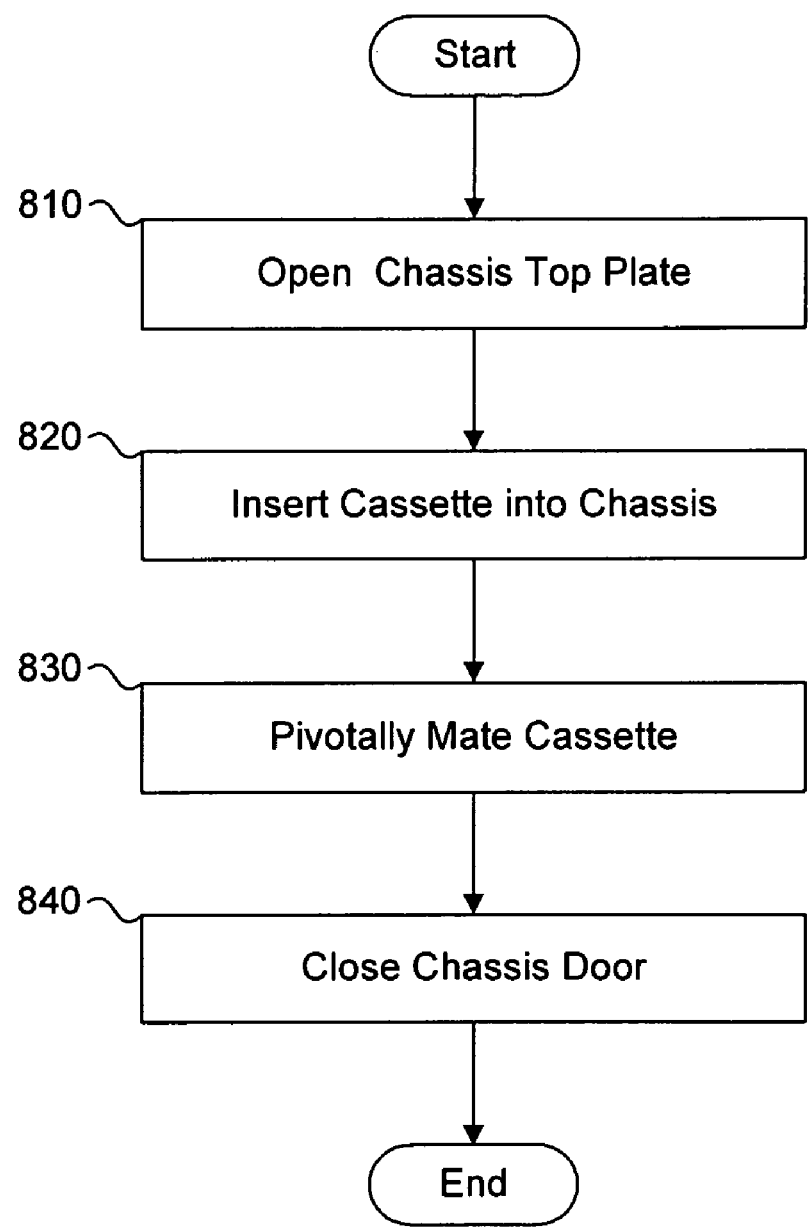
FIG. 8 is a process flow chart diagram of one embodiment of a method for inserting a cassette into a chassis and pivoting an expansion card into an expansion connector.

Referring to FIG. 8, one embodiment of a process 800 for inserting an expansion card 140 and cassette 200 into a chassis 120 includes the steps of opening 810 a chassis lock, inserting 820 a cassette into the chassis 120, pivotally mating 830 the expansion card 140 to the expansion connector 130, and closing 840 the chassis lock.

Figure 9A:
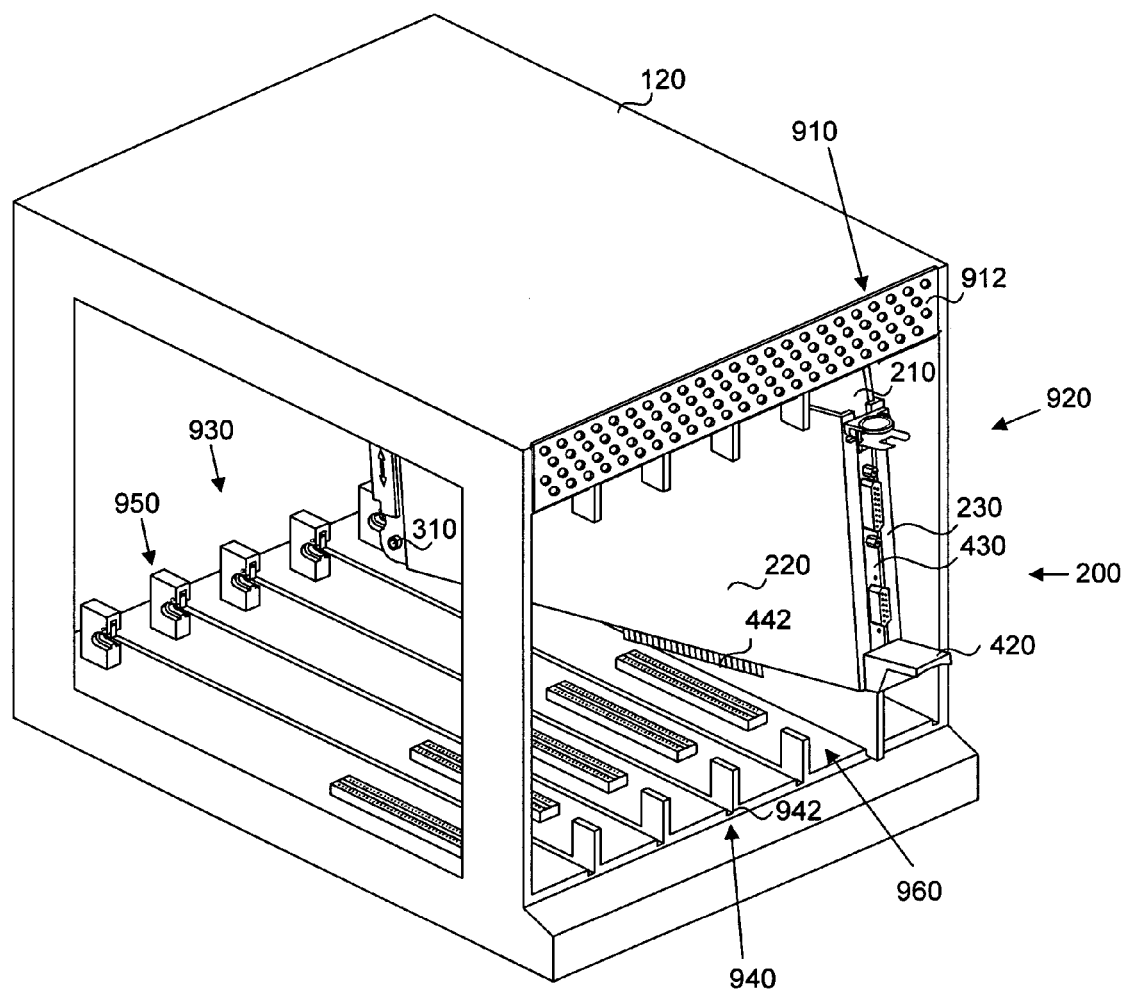
FIG. 9A is a perspective view of one embodiment of a cassette within a chassis in accordance with the current invention.

Referring also to FIG. 9A, a chassis lock 910 may restrain an expansion card 140 once inserted within the chassis 120 and connected to the expansion connector 130. Restraining the expansion card 140 may guard against loosening of the expansion card 140 from the expansion connector 130 due to vibration, creeping of materials, expansion due to heat, or other such effects. In the illustrated embodiment, a chassis lock 910 may be embodied as a hinged chassis top plate 912, hingedly attached at the top of the opening 920 through which a cassette 200 is inserted. Accordingly, opening 920 the chassis lock 910 may include opening the chassis top plate 912 as illustrated in FIG. 9A.

Inserting 820 the cassette 200 into the chassis 120 includes inserting the combined cassette 200 and chassis 120 longitudinally through the opening 920 in the chassis 120 into one of the bays 960 formed in the chassis 120. When inserted, the tail stock 430 is typically exposed through the opening 920 and the pivot stud 310 is typically located at the far end 930 of the chassis. A guide 940, such as slot 942, may be formed in the chassis 120 to guide insertion of the front plate 210 and restrain the front plate 210 against horizontal and vertical movement once inserted. Inserting 820 the cassette 200 may also include holding the back plate 220 in an upwardly pivoted position as illustrated. Accordingly, a user may grasp the handle 420 and both lift and push the handle 420 to insert the cassette 200 into the chassis 120.

Figure 9B:
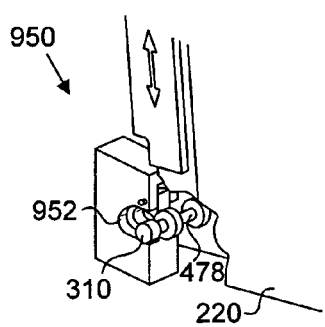
FIG. 9B is a perspective view of one embodiment of a cassette coupler in an open position in accordance with the current invention.
Figure 9C:
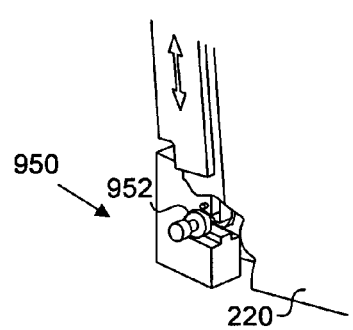
FIG. 9C is a perspective view of one embodiment of a cassette coupler in a closed position in accordance with the current invention.

Referring to FIGS. 9B and 9C, inserting 820 the cassette 200 into the chassis 120 also includes engaging the chassis groove 478 of the pivot stud 310 with a cassette lock 950 to secure the pivot stud 310 during pivoting. The cassette lock 950 may be any structure capable of capturing a portion of the cassette 200 and preventing vertical motion thereof. In the illustrated embodiment, the cassette lock 950 is a hook 952, or slot 952, into which the chassis groove 478 may be slid during insertion 820.

Figure 9D:
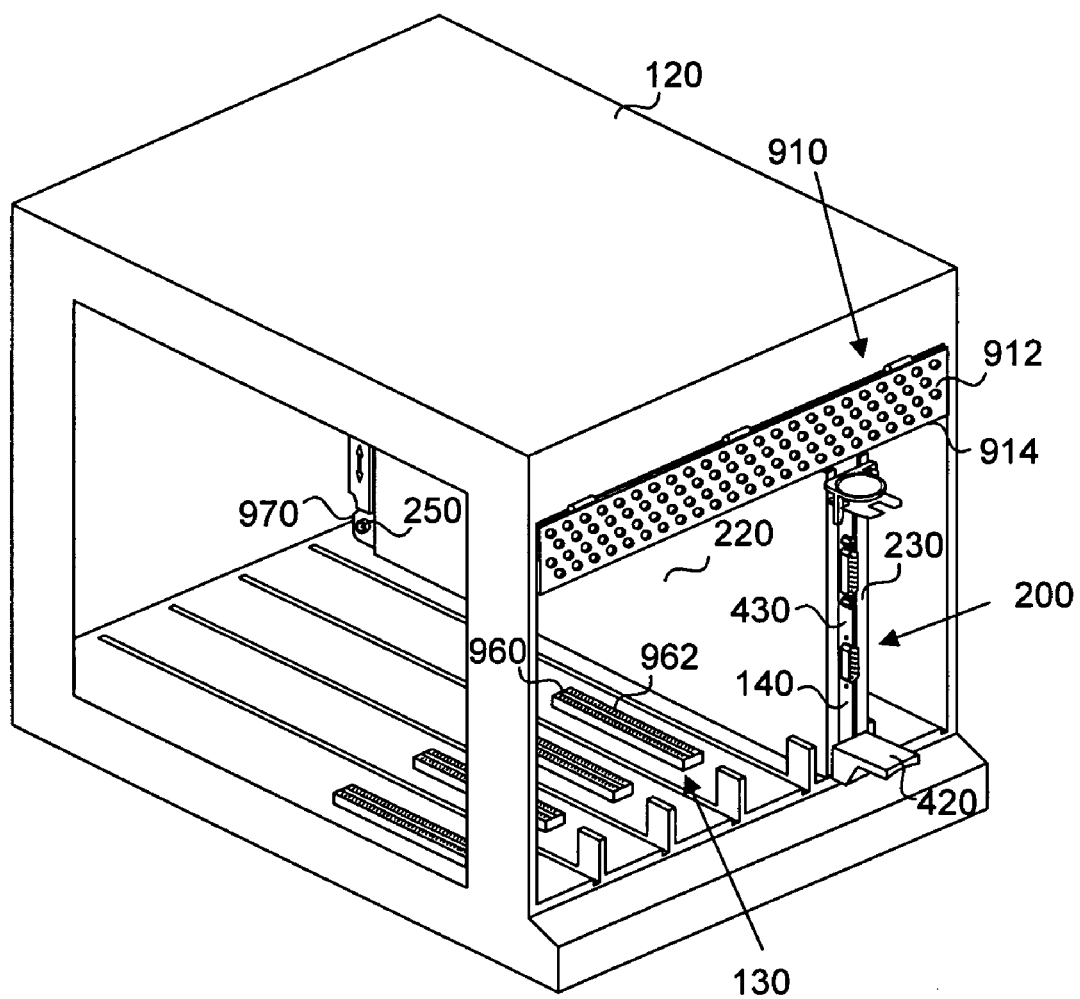
FIG. 9D is a perspective view of a cassette within a chassis.

Referring to FIG. 9D, pivotally mating 830 the expansion card 140 with the expansion connector 130 includes applying a downward pressure on the handle 420 causing the back plate 220 and attached expansion card 140 to pivot about the plate coupler 250. It will be noted that in the illustrated embodiment, force is applied at both ends of the cassette 200. Both the applied force at the handle 420 and the reaction forces at the plate coupler 250 will be exerted on the back plate 220. In this manner, a large bending movement, or rotational force, need not be exerted on the expansion card 140 proximate the tail stock 430 in order to exert a downward force on the connection fingers 442 (See FIG. 9A) of the expansion card 140.

Pivotally mating 830 the expansion card 140 with respect to the expansion connector 130 provides the additional benefit of engaging the connection fingers 442 (See FIG. 9A) of the expansion card 140 with the expansion connector 130 sequentially rather than simultaneously. Pivotal mating 830 requires that the portion 960 of the expansion connector 130 closest to the pivot point 970 engage the expansion card 140 before the portion 962 further therefrom. Sequential engagement of the connection fingers 442 (See FIG. 9A) reduces the amount of force necessary for insertion. Only a force sufficient to insert a portion of the connection fingers 442 (See FIG. 9A) need be exerted on the expansion card 140.

Closing 840 the chassis lock includes restraining the inserted and connected expansion card 140 against loosening from the expansion connector 130. Accordingly, closing 840 the chassis lock 910 may include closing the chassis top plate 912. When closed, the lower edge 914 of the chassis top plate 912 may abut the top of the back plate 220 preventing upward movement thereof.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for toolless installation and removal of an expansion card, the apparatus comprising:
    a cassette configured to provide an interior for substantially enclosing an expansion card, the cassette configured to facilitate insertion of the expansion card into a chassis;
    the cassette comprising a front plate, a back plate, and a pivot stud configured to pivotally couple the front plate and the back plate; and
    at least one card fastener adjustable to a dimension length of the expansion card.

2. The apparatus of claim 1, wherein the at least one card fastener comprises a stop guide configured to receive a movable stop.

3. The apparatus of claim 1, wherein the cassette comprises a front plate, a back plate, and a pivot stud configured to pivotally couple the back plate and the front plate.

4. The apparatus of claim 3, wherein the at least one card fastener is configured to removably secure the expansion card to the cassette.

5. The apparatus of claim 1, further comprising a handle configured to facilitate phased insertion of the expansion card into the chassis.

6. The apparatus in claim 1, further comprising a card coupler configured to removably secure the expansion card to the cassette.

7. The apparatus of claim 6, wherein the card coupler comprises at least one latch.

8. The apparatus of claim 6, wherein the card coupler comprises at least one hook.

9. The apparatus of claim 8, wherein the cassette further comprises a side plate, and wherein a hook of the least one hook is configured to removeably secure the expansion card to the side plate.

10. The apparatus of claim 1, further comprising at least one card guide configured to guide insertion of the expansion card into the cassette.

11. A method for toolless installation and removal of an expansion card, the method comprising:
   substantially enclosing an expansion card within a cassette configured to facilitate insertion of the expansion card into a chassis, the cassette comprising a front plate, a back plate, and a pivot stud configured to pivotally couple the front plate and the back plate; and
   securing the expansion card within the cassette with at least one card fastener that is adjustable to a dimension length of the expansion card.

12. The method of claim 11, further comprising mating the expansion card with an expansion connector.

13. The method of claim 12, wherein mating comprises pivoting the expansion card with a handle of the cassette.

14. The method of claim 12, wherein mating comprises sequentially expanding a plurality of connection fingers.

15. The method of claim 11, further comprising inserting the cassette into a chassis.

16. The method of claim 11, further comprising removing the expansion card from the cassette.

17. A system for toolless installation and removal of an expansion card, the system comprising:
   a chassis configured to receive a cassette;
   the cassette having an interior for substantially enclosing an expansion card, the cassette having a front plate, a back plate, and a pivot stud configured to pivotally couple the front plate and the back plate and facilitate insertion of the expansion card into the chassis; and
   at least one card fastener adjustable to a dimension length of the expansion card.

18. An apparatus for toolless installation and removal of an expansion card, the apparatus comprising:
   a support structure for direct engagement with a chassis;
   at least one card fastener adjustably coupled to the support structure, the card fastener comprising a zip slide for securing expansion cards of various sizes to the support structure.

19. The apparatus of claim 18, wherein the card fastener comprises a zip slide.

20. The apparatus of claim 18, wherein the card fastener directly engages the expansion card.

21. The apparatus of claim 18, wherein the card fastener is adjustable without the use of tools.

* * * * *